United States Patent [19]

Bartur et al.

[11] Patent Number: 4,478,881
[45] Date of Patent: Oct. 23, 1984

[54] TUNGSTEN BARRIER CONTACT

[75] Inventors: Meir Bartur; Marc Nicolet, both of Pasadena, Calif.

[73] Assignee: Solid State Devices, Inc., La Mirada, Calif.

[21] Appl. No.: 334,561

[22] Filed: Dec. 28, 1981

[51] Int. Cl.³ .......................................... H01L 21/285
[52] U.S. Cl. ...................................... 427/90; 427/84; 427/91; 427/93
[58] Field of Search ...................... 427/90, 91, 93, 84

[56] References Cited

U.S. PATENT DOCUMENTS 3,562,604 2/1971 VanLaer ............................... 427/90
3,906,540 9/1975 Hollins ................................. 357/67
4,310,568 1/1982 Howard ................................ 427/91

FOREIGN PATENT DOCUMENTS 1210162 10/1970 United Kingdom .

Primary Examiner—John D. Smith
Attorney, Agent, or Firm—Spensley, Horn, Jubas & Lubitz

[57] ABSTRACT

A semiconductor contact has a thin barrier layer less than 500 angstroms in thickness of a metal such as tungsten applied between an aluminum contact layer and a metal-semiconductor compound. The metal semiconductor compound forms a junction with an underlying semiconductor substrate. The thin barrier prevents a chemical reaction between the aluminum of the contact layer and the metal of the metal-semiconductor compound.

7 Claims, 4 Drawing Figures

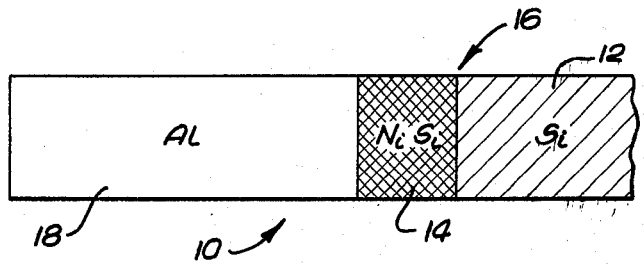
FIG. 1A.
PRIOR ART
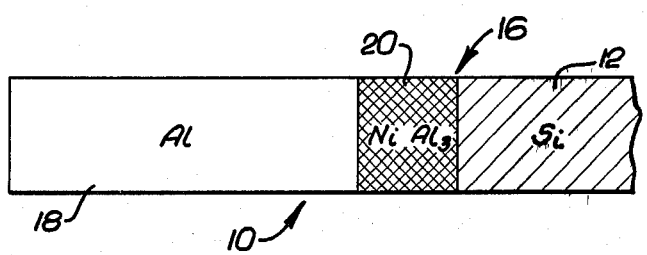
FIG. 1B.
PRIOR ART
FIG. 2.
PRIOR ART
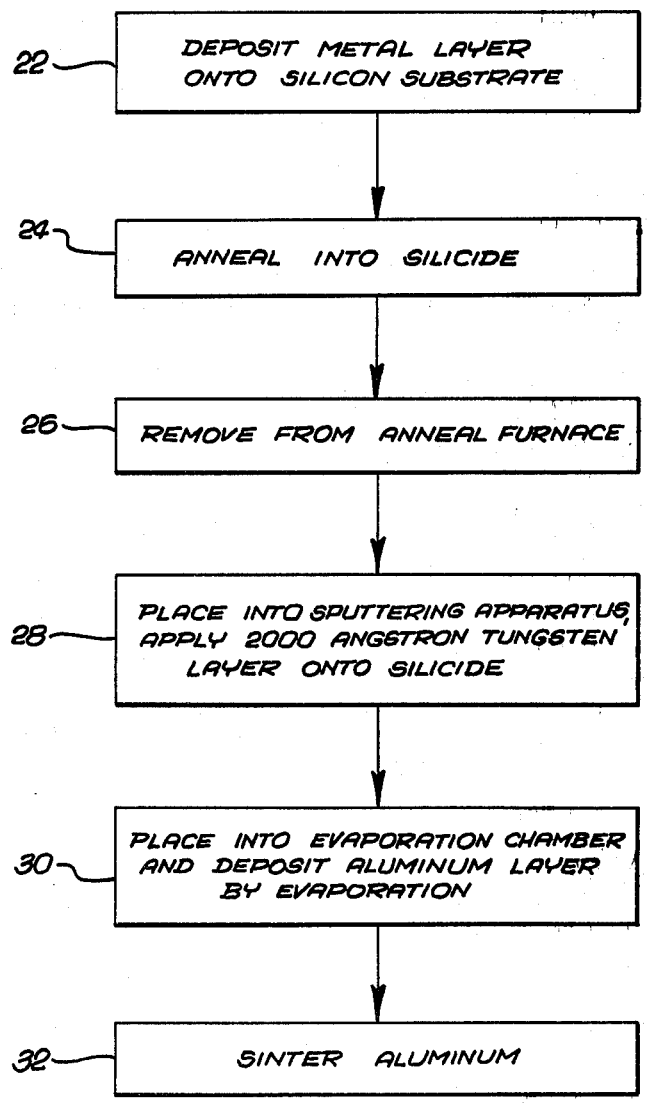

TUNGSTEN BARRIER CONTACT

BACKGROUND OF THE INVENTION

1. Field of the Invention.

The present invention relates to semiconductor devices, and more particularly, to aluminum contacts to metallic compounds in a semiconductor device.

Contact between a metal such as aluminum and a semiconductor generally results in two types of metal-semiconductor junctions. One type is a rectifying contact forming a metal-semiconductor diode (often referred to as a Schottky barrier or Schottky diode) having volt-ampere characteristics very similar to those of a p-n junction diode. The other type of contact, often referred to as an ohmic contact, is non-rectifying and is generally used when a lead is attached to a semiconductor.

2. Description of the Prior Art.

These ohmic and Schottky diode contacts can also be made between a semiconductor and metal-semiconductor compounds such as silicides which are compounds of silicon and a metal. The silicide is typically formed by depositing a metal layer such as nickel, cobalt, titanium, etc. onto a silicon substrate and subjecting it to a heat treatment known as annealing. During the annealing process, the metal layer spreads into the silicon substrate forming a silicide region in contact with the remaining silicon substrate. The silicide-silicon contact may be either an ohmic or Schottky diode contact depending upon the doping level of the silicon.

Silicide contacts to the silicon substrate are desirable because of the reproducibility of their electrical characteristics. However, aluminum frequently remains a preferred metal for the final contact to bonding pads or to other devices on the substrate. Aluminum contacts are typically formed by depositing a layer of aluminum on the region to be contacted (FIG. 1A). The aluminum layer is then generally treated to a heat treatment referred to as sintering. Sintering the aluminum layer allows the aluminum to form a better contact with the underlying region.

It has been found, however, that many aluminum-silicide contacts exhibit a thermal instability during the sintering cycle. That is, many silicides react with the aluminum in the temperature range used to sinter the aluminum contact (typically 400°–500° C.). This chemical reaction leads to the formation of intermetallic compounds from the aluminum and the silicide. Thus, for example, sintering an aluminum contact layer on a nickel silicide region has been found to form the intermetallic $NiAl_3$ (FIG. 1B). The chemical reaction between the aluminum and the silicide further has been found to raise the Schottky barrier height of the silicide-silicon junction, which raises the forward voltage drop of the junction. This in turn increases the power consumed by the junction and may make the silicide contact unsuitable for many applications. In addition, the aluminum-silicide reaction may not proceed uniformly during the sintering cycle of the aluminum. As a result, the current flow through the sintered aluminum-silicide contact may not be uniform. This can lead to excessive current in some locations within the contact resulting in failure of the device.

In order to prevent the silicide from reacting with the aluminum during the sintering of the aluminum contact, it has been proposed (G. J. Van Gurp, J. C. C. Dames, A. Van Oostrom, L. J. M. Augustus, and Y. Tammings, J. Appl. Phys. 50, 6915 (1979)) to "sputter" deposit a 2,000 angstrom (0.2 micron) layer of tungsten on the silicide before depositing the aluminum to provide a barrier between the aluminum and the silicide. (Alternatively, a 1,000 angstrom layer of a tungsten-titanium composition was also proposed.) It was reported that the sputter deposited intermediate layer of tungsten (or tungsten-titanium) was effective in preventing a chemical reaction between the aluminum and the silicide. Because of the relatively large thicknesses of these intermediate layers (1,000–2,000 angstroms), it is generally required that these layers be sputter deposited with a sputtering apparatus. Other methods for depositing a metal layer, such as evaporation deposition with an electron beam gun, generally are not suitable for depositing layers of tungsten in excess of 250 to 500 angstroms thick.

Accordingly, Van Gurp, et al. suggests that after the annealing of the silicide region is complete, the device be removed from the annealing furnace and placed in a separate sputtering apparatus to have the tungsten layer sputter deposited on the silicide. It is then proposed that the aluminum layer be deposited on the tungsten layer by evaporation using an electron beam gun (E-gun). Because sputter depositing typically requires a separate apparatus, it would be highly desirable to eliminate the need for depositing the intermediate tungsten barrier layer on the silicide region by sputter depositing. This will allow devices using such a contact barrier layer to be manufactured more economically.

SUMMARY OF THE INVENTION

It is an object of the present invention to provide a contact having a barrier layer, for a semiconductor device wherein the barrier layer need not be sputter deposited.

It is another object of the present invention to provide a contact for a semiconductor device wherein the annealing and sintering operations may be performed in a single step.

In accordance with the present invention, a contact for a semiconductor device is provided having an intermediate barrier layer of metal between an aluminum contact layer and a metal-semiconductor compound. The barrier layer has a thickness of less than 500 angstroms so that it may be conveniently deposited by evaporation with an electron beam gun, for example. The intermediate barrier layer may be made of tungsten or another metal such as tantalum or hafnium.

The thin barrier layer (less than 500 angstroms) obviates the need for sputter depositing the barrier layer onto the metal-semiconductor compound. Since an electron beam gun may utilize several evaporation sources, the desired metal layers may be sequentially deposited on the semiconductor. Thus, for example, a metal layer for forming a metal-semiconductor compound such as a silicide, a tungsten layer for forming a barrier layer and an aluminum contact layer may be sequentially deposited without having to interrupt the depositing operation to place the device in a sputtering apparatus. Furthermore, once the three metal layers are deposited, the device may be heated to anneal the metal and silicon to form the silicide and to also sinter the aluminum contact layer, all in a single heating step. Accordingly, the manufacturing process for fabricating the contacts is greatly simplified and the cost is significantly reduced.

BRIEF DESCRIPTION OF THE DRAWINGS

FIG. 1A is a schematic diagram of a prior art aluminum/silicide/silicon contact;

FIG. 1B is a diagram of the contact of FIG. 1A after sintering the aluminum;

FIG. 2 is a flow chart of a prior art process for fabricating an aluminum/silicide/silicon contact;

DETAILED DESCRIPTION OF THE DRAWINGS

Figure 3:
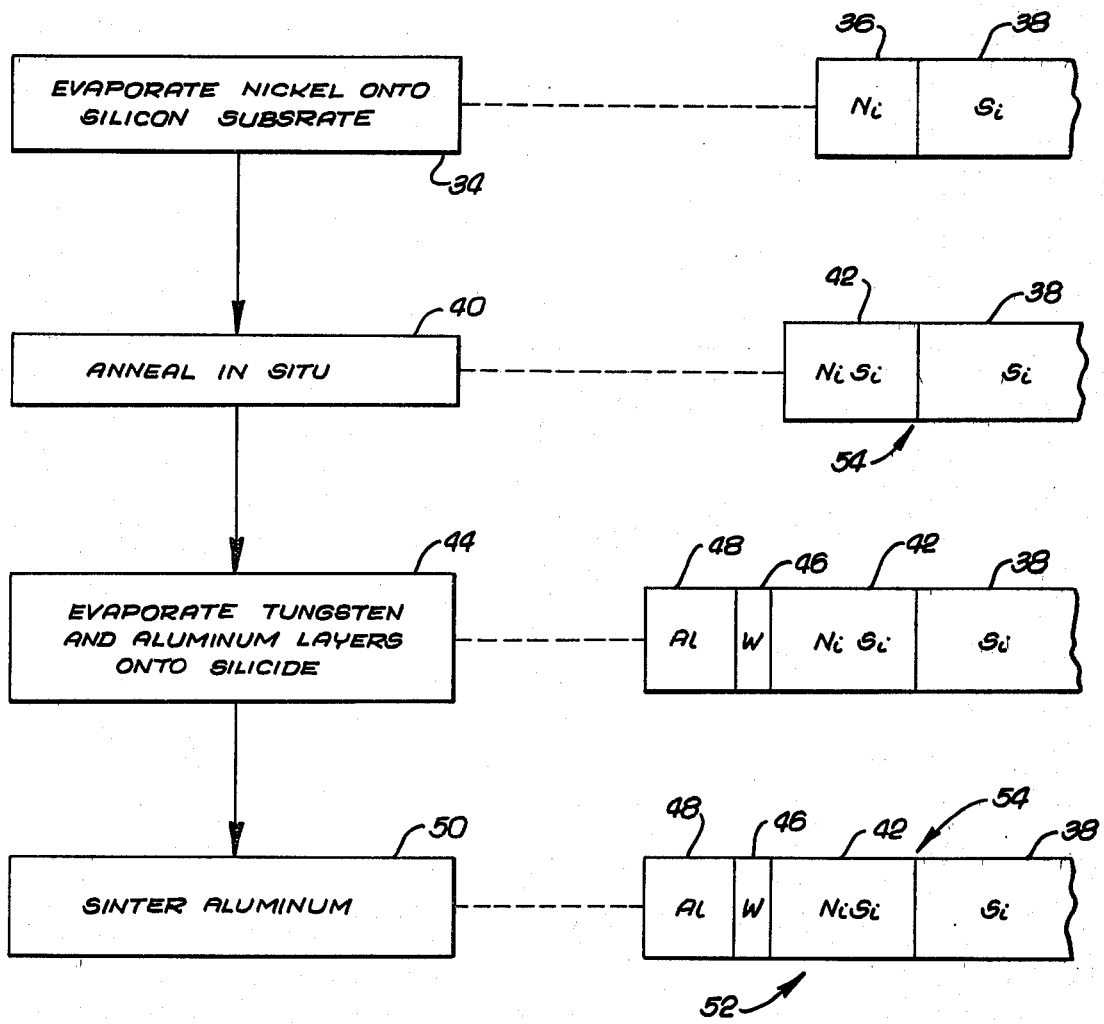
FIG. 3 is a flow chart describing a fabrication process for an aluminum/silicide/semiconductor contact in accordance with the present invention with schematic diagrams of the contact at various stages of the process.

A schematic representation of a prior art silicide contact 10 to a silicon region 12 is shown in FIG. 1A. The contact 10 has a silicide region 14 formed on the silicon region 12 to which it is making contact. The silicon region 12 represents a portion of a semiconductor device, such as the collector region of a bipolar transistor, for example, on a silicon wafer or substrate. The silicide region 14 is formed by depositing a layer or film of metal such as nickel on the silicon substrate and annealing the nickel and silicon by heating the substrate in a furnace. Annealing causes the nickel to spread into the silicon forming the nickel silicide, NiSi, in the region 14 within the silicon region 12. The electrical properties of the compound NiSi are metallic in nature such that the junction 16 between the silicide region 14 and silicon region 12 is similar to a metal-semiconductor junction. Thus, the nickel silicide region 14 can form either an ohmic or rectifying (Schottky diode) contact to the silicon region 12, depending upon the doping level of the silicon region 12.

As previously mentioned, it is often desirable to utilize aluminum to make the final electrical contact between the silicide region and a bonding pad or another device on the semiconductor substrate. Thus, the contact 10 in FIG. 1A has a layer 18 of aluminum deposited on the annealed nickel silicide region 14 to interconnect the region 14 with other devices or regions. The aluminum layer 18 is usually sintered which is a heat treatment to strengthen the aluminum and improve the bond between the aluminum and the nickel silicide region 14. However, due to the thermal instability of the aluminum layer 18 and the nickel silicide region 14, the heat of the sintering cycle causes the aluminum to migrate towards the silicide region 14. The aluminum then reacts with the silicide producing an intermetallic region 20 (FIG. 1B) of $NiAl_3$ between the silicon region 12 and the aluminum layer 18. This chemical reaction raises the Schottky barrier height of the junction 16 which raises the forward voltage drop for current flowing between the aluminum layer 18 and the silicon region 12. When used for ohmic contact, this rise will cause higher contact resistance. This increases the amount of power dissipated in the contact 10 and may render the contact 10 useless for many applications.

As previously mentioned, in order to prevent the chemical reaction between aluminum and the silicide, it has been previously suggested to sputter deposit a 2,000 angstrom layer of tungsten (or 1,000 angstrom layer of tungsten and titanium) between the silicon and the aluminum. FIG. 2 illustrates the process suggested by van Gurp, et al.

In the first step (described in the box indicated at 22, hereinafter "step 22"), a layer of metal is deposited onto a silicon wafer which is annealed in the next step 24 to form a particular silicide, depending upon the metal deposited. For example, cobalt has been deposited by electron beam evaporation at a pressure of about $10^{-6}$ Torr to produce the silicide of $CoSi_2$ by subsequent annealing at 550° C. for two hours in an atmosphere of $H_2/N_2$. Alternatively, it has been suggested to sputter deposit molybdenum and anneal at 600° C. for one hour in $H_2/N_2$ to produce the silicide of hexagonal $MoSi_2$. As another example, it was suggested to sputter deposit platinum and nickel onto silicon and anneal at 500° C. for thirty minutes in vacuum to produce the silicide $Pt_xNi_{1-x}Si$. The sputter depositions were generally carried out in argon at a pressure of $5 \times 10^{-3}$ Torr. The silicon wafers are then removed and placed into a different system to sputter deposit a 2000 angstrom layer of tungsten onto the silicide, as indicated in steps 26 and 28. The wafer is returned in step 30 for evaporation of the final aluminum contact layer. Finally, the aluminum layer is sintered in step 32.

As seen from the foregoing, the process described in the van Gurp, et al. publication requires that the tungsten barrier layer be sputter deposited in a system separate from that which was used to deposit the other layers of the contact. Thus, in addition to the expense of the additional sputtering equipment, this described process requires the vacuum or $H_2/N_2$ atmosphere used in the annealing step 24 to be broken during the removal step 26 in order to place the wafer into a separate sputtering apparatus. Furthermore, after the sputtering process is complete, the wafer is placed into an electron beam evaporation chamber which is pumped down again in order to deposit the aluminum layer. Additionally, it is seen that the annealing of the silicide and the sintering of the aluminum layer are carried out in two separate steps.

In general, it is impractical to deposit a 2,000 angstrom layer of tungsten (or 1,000 angstrom tungsten-titanium layer) by evaporation using an electron-beam gun. The maximum thickness of a tungsten layer obtained by evaporation is typically in the range of 250 to 500 angstroms. A 250 angstrom layer of tungsten is generally considered to be not very uniform and may have a large number of pin holes in the layer. Thus, it was previously thought desirable to have a layer in excess of 1,000 angstroms to insure that there are no pin holes in the layer.

An additional characteristic of sputtering the tungsten layer onto the silicide is the tendency of impurities from the ambient atmosphere to become mixed in with the metal layer being deposited, which may help the barrier properties of the deposited layer. For example, if nitrogen is used as the ambient gas in the sputtering apparatus, then nitrogen can become mixed into the tungsten barrier. The nitrogen impurity can possibly help the barrier prevent the aluminum-silicide reaction.

Referring now to FIG. 3, a flowchart is shown illustrating a process for fabricating a semiconductor contact 52 in accordance with the present invention. It has been found that a 2,000 or 1,000 angstrom barrier is not necessary to prevent the aluminum contact layer from reacting with the silicide. Instead, it has been found that an effective barrier layer of tungsten may be less than 500 angstroms in thickness, such as 250 angstroms, for example. It is quite practical to deposit a 250 angstrom tungsten barrier layer by evaporation using an electron beam gun. This can greatly simplify the fabrication techniques for manufacturing the semiconductor contact, as will be more clearly understood in the following description.

A 1350 angstrom layer 36 of nickel is deposited by evaporation with an electron beam gun onto a silicon region 38 of a silicon substrate. The nickel layer 36 and silicon region 38 are shown schematically and are not intended to represent actual physical shapes. The silicon region 38 may be a portion of a device in the silicon substrate, such as a transistor base or collector region for example. The initial deposition step is indicated at 34 in the accompanying flow chart.

The substrate is then annealed at 400° C. for five to fifteen minutes in step 40 so that the metal silicide, NiSi is formed in a region 42. A silicide-silicon junction 54 is thereby formed between the silicide region 42 and the remaining silicon region 38. The substrate may be annealed in situ, that is, it may be annealed in place so that the substrate need not be removed from the electron beam gun chamber in order to anneal the silicide. Alternatively, other metals such as cobalt, molybdenum or platinum may be substituted for the nickel to form other silicides. In addition, the thickness of the nickel layer and the annealing temperature are provided for illustrative purposes only.

After the annealing step is complete, the electron beam gun is reactivated in step 44 to deposit by evaporation a barrier layer 46 of tungsten from a second evaporation source, over the nickel silicide region 42. In the illustrated embodiment, the tungsten layer may be 250 angstroms thick, for example, but experiments have shown that tungsten layers as thin as 200 angstroms have worked sucessfully. Without removing the substrate from the electron beam gun chamber, the aluminum contact layer is deposited in a third metal layer 48 by evaporation from a third evaporation source onto the tungsten layer 46. The pressure in the electron beam gun deposition chamber during the evaporation may be less than $4 \times 10^{-7}$ Torr for the nickel deposition, less than $2 \times 10^{-7}$ Torr for the tungsten deposition and below $10^{-6}$ Torr for the aluminum deposition, for example. The above-described process is highly suitable for depositions by an electron beam gun since the electron beam gun can deposit layers of metals from three different evaporation sources without necessitating moving the wafer or substrate to a separate apparatus. The silicon substrate with the nickel silicide, tungsten and aluminum layers may then be placed in a quartz tube furnace to sinter the aluminum as indicated at step 50, completing the semiconductor contact 52. The sintering may be conducted at a pressure of less than $10^{-6}$ Torr residual pressure or can be done at atmospheric pressure also.

It has been found that the tungsten layer 46 of the contact 52 provides an effective barrier layer between the aluminum layer 48 and the nickel silicide region 42. This intermediate tungsten layer 46 prevents the aluminum from chemically reacting with the nickel silicide despite the tungsten layer 46 having a thickness of only 250 angstroms.

The silicide-silicon junction 54 of the contact 52 may be either an ohmic contact or a Schottky diode depending upon the doping of the silicon region 38. Since the tungsten layer 46 prevents the aluminum from reacting with the nickel silicide during the sintering step 50, the Schottky barrier height of the junction 54 is not raised thereby preventing an increase in the forward voltage drop, or the contact resistivity of the contact/junction 54. Furthermore, preventing the aluminum from reacting with the silicide insures the uniformity of the current flow through the nickel silicide region 42 from the aluminum and the tungsten layers. In this manner, the tungsten barrier layer 46 enhances the reliability and stability of the contact 52.

Figure 4:
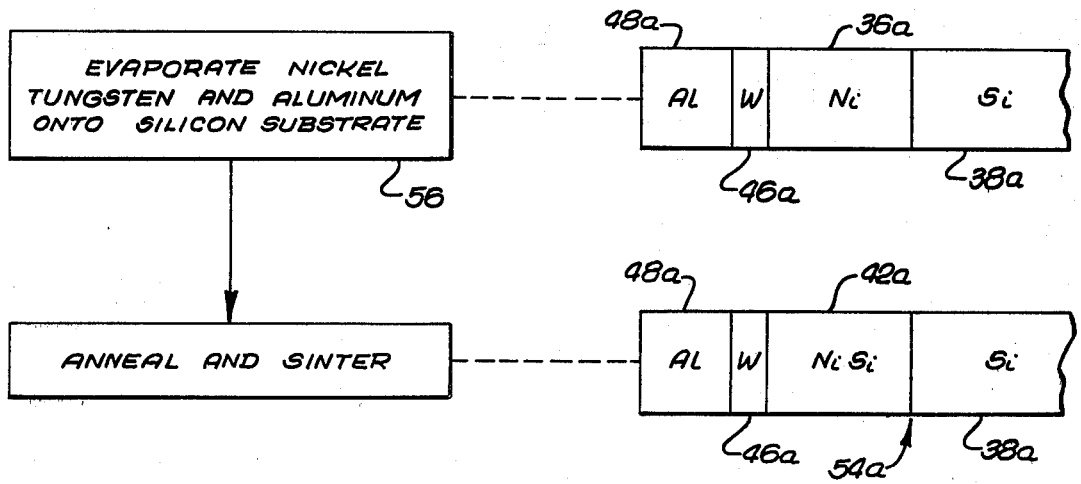
FIG. 4 is an alternative embodiment of the process and contact described in FIG. 3.

An alternative method for fabricating a semiconductor contact which more fully utilizes the advantages of the present invention is shown in FIG. 4. There the three layers of metal are sequentially evaporated onto a silicon region 38a without annealing after the first layer is deposited. This method is highly suitable for use with electron beam evaporation chambers since an electron beam gun can use several evaporation metal sources to sequentially deposit different metals onto a substrate.

Accordingly, as indicated in step 56, a 960 angstrom layer 36a of nickel may be deposited on a silicon region 38a. The nickel layer 36a is followed by a 250 angstrom layer 46a of tungsten deposited on the nickel layer 36a and a 2350 angstrom layer 48a of aluminum deposited on the tungsten layer 46a. These three metal layers can be sequentially deposited by evaporation in a single depressurized evaporation chamber without having to remove the substrate between layer depositions. Thus, the depressurization may be maintained while all three layers are deposited. There is no need to represssurize the chamber between layer depositions to remove the substrate.

After the three layers are deposited, the substrate may then be placed in a furnace at 430° C. to sinter the aluminum layer 48a. While the aluminum layer 48a is sintering, the nickel layer 36a is fully consumed in the nickel-silicon reaction forming the NiSi silicide region 42a adjacent the remaining silicon region 38a. It is seen in FIG. 4 that the aluminum contact layer 48a retains its integrity and does not chemically react with the nickel layer 36a. The tungsten layer 46a prevents the aluminum from reacting with the nickel so that the nickel can form the nickel silicide region 42a. Thus, the steps of annealing the nickel and silicon into the nickel silicide region and sintering the aluminum contact layer can now be performed in a single step.

Accordingly, it is seen from the foregoing that the aluminum reaction with the silicide can be suppressed by incorporating a thin tungsten barrier (less than 500 angstroms) between the silicide and the aluminum. The thinness of the barrier (less than 500 angstroms) between the silicide and the aluminum obviates the need for a separate sputtering apparatus. Furthermore, the barrier layer can be introduced in the same deposition step as the first metal layer and the aluminum contact. In addition, the annealing of the metal and silicon and the sintering of the aluminum contact layer can be done in a single heat treatment.

It will, of course, be understood that modifications of the present invention, in its various aspects, will be apparent to those skilled in the art, some being apparent only after study and others being merely matters of routine semiconductor fabrication and design. For example, other metals such as tantalum and hafnium might be substituted for tungsten to form the barrier layer between the aluminum contact and the silicide. In addition, the barrier layer of the present invention can form an effective barrier between an aluminum contact and other metal silicides such as the silicides of cobalt, platinum, and molybdenum. When relatively high annealing temperatures (approximately 600° C.) for silicide formation is needed the process descibed in FIG. 3 may be more appropriate. In addition, the thin barrier layer of the present invention may provide an effective barrier for contacts utilizing aluminum and other metal-semiconductor compounds such as germanicides. Other embodiments are also possible, with their specific designs dependent upon the particular application. As such, the scope of the invention should not be limited by the particular embodiments herein described, but should be defined only by the appended claims and equivalents thereof.

We claim:

1. A method of fabricating a semiconductor device comprising the steps of:
    depositing a first metal layer onto a silicon substrate;
    depositing a second metal layer onto the first metal layer, selected from the group consisting of tungsten, tantalum and hafnium;
    depositing an aluminum contact onto the second metal layer; and thereafter
    heating the substrate and metal layers on the substrate concurrently to anneal the first metal layer and the silicon substrate to form a silicide and also to sinter the aluminum contact in a single step, wherein the second metal layer prevents the aluminum from chemically reacting with the silicide during the single annealing and sintering step.

2. The method of claim 1 wherein the second metal layer is deposited in a layer having a thickness which is less than 500 angstroms.

3. The method of claim 1 wherein each of the metal layers is deposited by evaporation utilizing an electron beam gun.

4. The method of claim 1 wherein the first metal layer deposited is nickel so that a nickel silicide is formed during the annealing and sintering step.

5. A method of fabricating a semiconductor device comprising the steps of:
    depositing a layer of nickel onto a silicon substrate;
    depositing a layer of tungsten having a thickness of less than 500 angstroms on the nickel layer;
    depositing a contact layer of aluminum onto the tungsten;
    heating the substrate and metal layers in a furnace to anneal the nickel and silicon to form a nickel silicide and also to sinter the aluminum contact wherein the tungsten layer prevents the aluminum from chemically reacting with the nickel silicide and the annealing and sintering are performed in a single step.

6. A method of fabricating a semiconductor device comprising the steps of:
    depositing three sequential metal layers of nickel, tungsten and aluminum on a silicon substrate by evaporation in a depressurized electron beam gun chamber while maintaining the depressurization of the chamber between depositions; and
    heating the substrate in a furnace to anneal the nickel and silicon into nickel silicide and to concurrently sinter the aluminum to provide an electrical contact wherein the tungsten layer provides an electrical connection between the aluminum contact and the nickel silicide region and also prevents a chemical reaction between the nickel and the aluminum so that the nickel silicide will form rather than a nickel aluminum compound.

7. A method of fabricating a semiconductor device comprising the steps of:
    depositing a first metal layer for forming a metal silicide layer onto a silicon substrate in a depressurized chamber;
    depositing a second metal layer onto the first layer in the depressurized chamber, said second layer being selected from the group consisting of tungsten, tantalum and hafnium; and
    depositing an aluminum contact onto the second metal layer in the depressurized chamber;
    wherein the depressurization of the chamber is maintained between depositions.

* * * * *